(12) United States Patent
Heiderman et al.

(10) Patent No.: US 12,018,800 B2
(45) Date of Patent: Jun. 25, 2024

(54) METHOD AND SYSTEM FOR OPTIMIZED GAS DELIVERY WITH AUTOMATED REDUNDANT PRESSURE REGULATION SAFETY FEATURE

(71) Applicants: Douglas C. Heiderman, Akron, NY (US); Stanley M. Smith, Clarence Center, NY (US); William R. Gerristead, Grand Island, NY (US)

(72) Inventors: Douglas C. Heiderman, Akron, NY (US); Stanley M. Smith, Clarence Center, NY (US); William R. Gerristead, Grand Island, NY (US)

(73) Assignee: Praxair Technology, Inc., Danbury, CT (US)

( * ) Notice: Subject to any disclaimer, the term of this patent is extended or adjusted under 35 U.S.C. 154(b) by 11 days.

(21) Appl. No.: 17/707,292

(22) Filed: Mar. 29, 2022

(65) Prior Publication Data
US 2023/0313951 A1    Oct. 5, 2023

(51) Int. Cl.
*F17D 5/00*   (2006.01)
*F17C 7/00*   (2006.01)
*F17C 13/04*  (2006.01)
*H01L 21/67*  (2006.01)

(52) U.S. Cl.
CPC ............... *F17D 5/005* (2013.01); *F17C 7/00* (2013.01); *F17C 13/04* (2013.01); *H01L 21/67017* (2013.01); *F17C 2201/0104* (2013.01); *F17C 2205/0138* (2013.01); *F17C 2205/0323* (2013.01); *F17C 2205/0338* (2013.01); *F17C 2221/017* (2013.01); *F17C 2223/036* (2013.01); *F17C 2250/043* (2013.01); *F17C 2270/0518* (2013.01)

(58) Field of Classification Search
CPC ...... F17C 2250/0626; F17C 2205/0142; F17C 2270/0518; Y10T 137/87917; G05D 16/2033; F17D 5/005
See application file for complete search history.

(56) References Cited

U.S. PATENT DOCUMENTS 6,302,139 B1   10/2001  Dietz
6,474,077 B1   11/2002  Botelho et al.
7,104,292 B2    9/2006  Wodjenski

FOREIGN PATENT DOCUMENTS

WO    0183084 A1    11/2001

*Primary Examiner* — Reinaldo Sanchez-Medina
*Assistant Examiner* — Nicole Gardner (57) ABSTRACT

This invention relates to a method and system for improved gas delivery for regulating gas at a substantially constant delivery pressure on a consistent basis. The system includes an automated redundant pressure regulation safety feature that is specifically configured along a flow network to significantly reduce the occurrence of pressure surges due to failure of the gas to be regulated to the delivery pressure. By reducing the occurrence of pressure surges and utilizing higher pressure package gas sources, the frequency of changeouts can be lowered.

31 Claims, 5 Drawing Sheets

METHOD AND SYSTEM FOR OPTIMIZED GAS DELIVERY WITH AUTOMATED REDUNDANT PRESSURE REGULATION SAFETY FEATURE

FIELD OF THE INVENTION

This invention relates to a unique method and system for delivery of gas from a relatively higher pressure packaged gas source such as a single cylinder or a cylinder source pack, in which an automated redundant pressure regulation safety feature is incorporated into a fill manifold to reduce occurrence of pressure surges and thereby ensure substantially constant delivery pressure to a downstream processing unit.

BACKGROUND OF THE INVENTION

There are many operations that utilize large amounts of gas. For example, there is a need in the semiconductor industry to provide higher volumes of inert laser gases. Today, the inert laser gases are typically supplied in individual cylinders that are filled to approximately 2100 psig. However, a single cylinder source requires frequent cylinder changeouts. Change out procedures to a new cylinder source require operator time, potential customer operation downtime and risk of injury during the connection and disconnection of the pressurized gases.

Consequently, the semiconductor industry has shifted in large part to a usage of multiple cylinders that are manifolded together to create a cylinder source pack, also referred to herein and throughout as "multi-cylinder source packs" or "bundles." The cylinder source pack can contain 6 or more cylinders thereby resulting in a much larger volume of deliverable gas in comparison to the single cylinder deliverable option.

However, despite a reduction in cylinder changeouts in comparison to a single cylinder, the usage of cylinder source packs continue to create unacceptably high frequency changeouts. Interrupted supply of inert laser gases for semiconductor fabrication processes typically lead to significant downtime, production costs and unacceptable reduction in throughput. The drawbacks emerge, at least in part, due to a limited maximum available working pressure in some cases to be 2400 psig or less.

As such there is an unmet need to increase the quantity of gas supplied from a cylinder source pack to increase productivity and reduce potential injury.

SUMMARY OF THE INVENTION

This invention in a first aspect relates to an improved gas storage and delivery system for regulating gas at a substantially constant delivery pressure, comprising: a cylinder source pack comprising 6 or more cylinders, each cylinder holding gas at a cylinder source pressure of 3000 psig or higher; the cylinder source operably connected to a fill manifold, said fill manifold comprising one or more conduits positioned between the cylinder source pack and a downstream processing unit; the fill manifold further comprising an automatic redundant pressure regulation safety feature, said automated redundant pressure regulation safety feature comprising a primary integrated regulator valve (IRV), said primary IRV not operably connected to a pressure relief device (PRV), said automated redundant pressure regulation safety feature further comprising a backup IRV operably connected to a PRV, wherein said backup IRV is in a deactivated state defined as non-regulating and not relieving any excess pressure of the gas in the fill manifold to atmosphere when the primary IRV is regulating and reducing the source pressure of the gas to the delivery pressure, and further wherein said backup IRV is adapted to switch from the deactivated state to an activated state in response to said primary IRV having failed to regulate and reduce the pressure of the gas from the cylinder source pressure to the delivery pressure.

This invention in a second aspect relates to a method for regulating gas at a substantially constant delivery pressure on an uninterrupted basis, comprising: withdrawing gas from a cylinder source pack having a cylinder source pressure of at least 3000 psig or higher; introducing the gas into a fill manifold; directing the gas along a first conduit of the fill manifold into an inlet of a first IRV that is not operably connected to a PRV; flowing the gas from the outlet of the first IRV and then directing the gas into an inlet of a second IRV that is operably connected to a PRV along the first conduit; followed by either performing a step of: (i) maintaining the second IRV in an open position that is in a non-regulating position when a pressure of the gas at the outlet of the first IRV is regulated and reduced to the delivery pressure; or (ii) activating the second IRV from the non-regulating position to a pressure regulating position that regulates and reduces the pressure of the gas to the delivery pressure when the pressure of the gas at the outlet of the first IRV is determined to be at or above a set point value indicative of the first IRV having failed.

This invention in a third aspect relates to a method for regulating gas at a substantially constant delivery pressure on an uninterrupted basis, comprising: withdrawing gas from a cylinder source pack having a cylinder source pressure of at least 3000 psig or higher; introducing the gas into a fill manifold; configuring into an open position a first isolation valve located upstream of a first IRV that is not operably connected to a PRV; flowing the gas into an inlet of the first IRV located along a first conduit of the fill manifold while maintaining or configuring into a closed position a second isolation valve located upstream of the second IRV that is operably connected to a PRV, wherein each of said second isolation valve, second IRV and the PRV is situated along the second conduit; measuring a pressure of the gas from an outlet of the first IRV; and either performing a step of: (i) determining the first IRV to have failed based on the measured pressure at the outlet of the first IRV, and in response thereto; closing the first isolation valve upstream of the first IRV, and opening the second isolation valve upstream of the second IRV and redirecting the gas through the second IRV along the second conduit; regulating and reducing the pressure of the gas to a delivery pressure; and directing the gas to a downstream processing unit; or (ii) determining the first IRV to be in a regulating mode based on the measured pressure at the outlet of the first IRV, and in response thereto; maintaining the first isolation valve of the first IRV in the open position, while maintaining the second isolation valve along the second conduit IRV in the closed position; directing the gas through the first IRV along the first conduit; regulating and reducing the pressure of the gas to the delivery pressure; and directing the gas to the downstream processing unit.

This invention in a fourth aspect relates to an improved gas storage and delivery system for regulating gas at a substantially constant delivery pressure, comprising: a packaged gas source having a source pressure of up to 6000 psig or higher; a fill manifold operably connected to the packaged gas source, said fill manifold comprising a conduit positioned between the packaged gas source and a downstream processing unit; an automatic redundant pressure regulation safety feature, said automatic redundant pressure regulation safety feature comprising a primary integrated regulator valve (IRV) not operably connected to a pressure relief device (PRV) and a backup IRV that is operably connected to a PRV; wherein said automatic regulation safety feature is configured to switch from the primary IRV to the backup IRV upon determination of the primary IRV having failed, said switch occurring without incidence of delivery pressure surges.

This invention in a fifth aspect relates to a method for regulating gas at a substantially constant delivery pressure on an uninterrupted basis, comprising: withdrawing gas from a cylinder source pack having a cylinder source pressure of at least 3000 psig or higher; introducing the gas into a fill manifold; configuring into an open position a first isolation valve located upstream of a first IRV that is not operably connected to a PRV; flowing the gas into an inlet of the first IRV located along a first conduit of the fill manifold; measuring a pressure of the gas from an outlet of the first IRV; and either performing a step of: (i) determining the first IRV to have failed based on the measured pressure at the outlet of the first IRV, and in response thereto; closing the first isolation valve upstream of the first IRV, and redirecting a flow of the gas through the second IRV along a second conduit, said second IRV operably connected to a PRV; regulating and reducing the pressure of the gas to a delivery pressure; and directing the gas to a downstream processing unit; or (ii determining the first IRV to be in a regulating mode based on the measured pressure at the outlet of the first IRV, and in response thereto; maintaining the first isolation valve of the first IRV in the open position to regulate and reduce the pressure of the gas to the delivery pressure; and directing the gas therethrough to a downstream processing unit at the delivery pressure.

This invention in a sixth aspect relates to a method for remotely monitoring a change in status of pressure of a packaged gas source, comprising: providing a pressure device operably connected upstream of an automatic redundant pressure regulation safety feature and downstream of a packaged gas source; measuring a real-time source pressure of the package gas source; generating a first signal corresponding to the real-time source pressure; transmitting the first signal to an authorized recipient via a pressure communication pathway; said first signal providing notification of the source pressure remaining in the packaged source, including a notification message when applicable that the package source is depleted.

This invention in a seventh aspect relates to a method for remotely monitoring a change in status of an automatic redundant pressure regulation safety feature, comprising: providing a pressure device operably connected to an outlet of a primary IRV of an automatic redundant pressure regulation safety feature that is operably connected to a packaged gas source; measuring a real-time delivery pressure of gas at the outlet of the primary IRV; generating a first signal corresponding to the real-time delivery pressure of the gas; transmitting the first signal to an authorized recipient via a pressure communication pathway; providing notification of a status of the delivery pressure of the gas prior to flow of the gas to a downstream processing unit, including a notification message when applicable that the primary IRV has failed.

DETAILED DESCRIPTION OF THE INVENTION

The drawings are for the purpose of illustrating the invention and are not intended to be drawn to scale. The embodiments are described with reference to the drawings in which similar elements are referred to by like numerals. The invention is not limited to the embodiments illustrated in the drawings. Certain features are intentionally omitted in each of the drawings to better illustrate various aspects of the automated redundant safety feature and its operation.

The relationship and functioning of the various elements of the embodiments are better understood by the detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

As will be described, the present invention offers a method and system for ensuring substantially constant delivery pressure of gas supply to a downstream processing unit 7 while increasing gas utilization and reducing package gas source changeout by increasing reliability of the process 11. The process 11 is designed to incorporate 2 or more points of failure via an automated redundant pressure regulation safety feature to substantially reduce likelihood of a pressure regulation failure.

"Conduit" and "flow leg" as used herein and throughout may be used interchangeably to mean flow paths within the process 11 for delivery of gas whereby the flow paths can be formed by any conventional piping, hoses and the like.

"Packaged gas source" as used herein and throughout is intended to refer to any gas storage and delivery system, including a single cylinder or a cylinder source pack, including, but not limited to a 6-cylinder pack or a 12-cylinder pack, or other suitable storage, filling or delivery vessel capable of being subject to pressure such as a dewar, bottle, tank, barrel, bulk and microbulk.

"Connected" or "operably connected" may be used interchangeably herein and throughout to mean a direct or indirect connection.

"Failed" or "failed state" means the inability to regulate and reduce the pressure of the gas to a target pressure range.

"Pressure device" as used herein and throughout can include a gauge, pressure indicator, pressure transducer or any other suitable pressure reading device.

"Electronic grade purity" means, but is not limited to having a purity level of 99.9999 vol % or a total impurities level of less than 1 ppm.

"Primary IRV" and "Primary IRV with no PRV" may be used interchangeably herein and throughout. "Primary IRV" may also be referred to herein and throughout as a "first IRV."

"Backup IRV" and "Backup IRV with PRV" may be used interchangeably herein and throughout. "Backup IRV" may also be referred to herein and throughout as a "secondary IRV."

"UHP valve" means an ultra-high purity valve that can maintain the electronics grade purity of pressurized gases contained within and delivered from a packaged gas source, such as a cylinder source pack and have helium leak rates of at least 1e-8 atm-cc/sec helium through all gas wetted seals in the valve.

Figure 1:
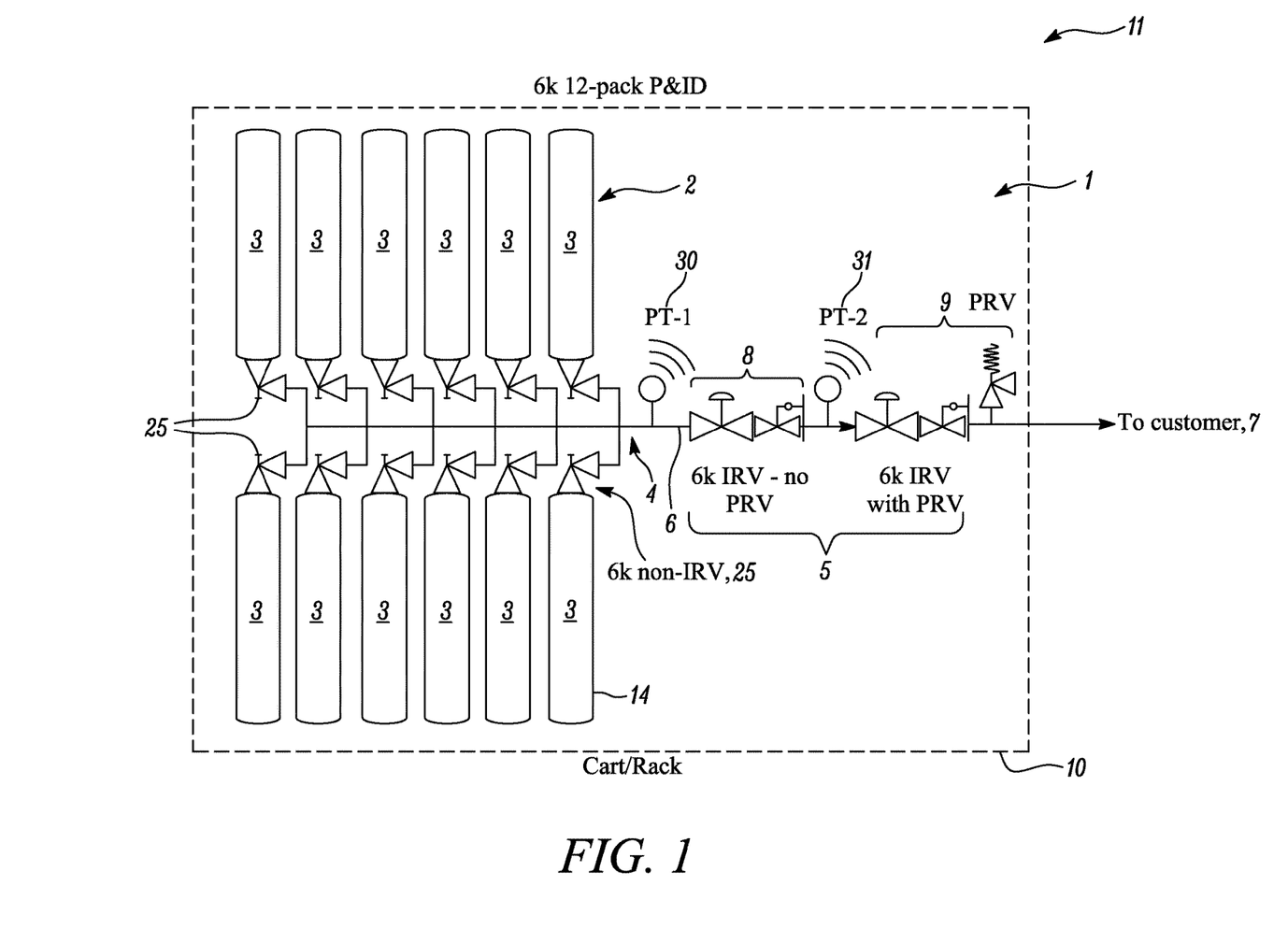
FIG. 1 is a process schematic that employs a modular platform that is pre-assembled with a cylinder source pack, fill manifold, pressure devices and automated redundant pressure regulation safety feature for optimizing the supply of gas at substantially constant delivery pressure to a downstream processing point of use in accordance with the principles of the present invention.

In one aspect, and as will now be described with reference to FIG. 1, the present invention relates to an improved gas storage and delivery system 1 for regulating gas 3 at a substantially constant delivery pressure. System components include an improved gas storage and delivery system 1 which includes a packaged gas source connected to a fill manifold 4. The packaged gas source preferably is a cylinder source pack 2 that can include 6 or more high pressure cylinders 14, with each cylinder capable of holding gas 3 at a pressure of 3000 psig or more, and more preferably up to 6000 psig or more. In a preferred embodiment, the cylinder source pack 2 has 12 high pressure cylinders 14 as shown in FIG. 1. Although FIG. 1 is shown with 12 cylinders forming the cylinder source pack 2 manifolded together in a preferred embodiment, it should be understood that high pressure cylinders 14 can be modified as known in the art to hold a higher number or lower number of cylinders at a suitable pressure as needed for a particular application. Each of the 12 high pressure cylinders 14 is connected to a fill manifold 4. The fill manifold 4 comprises one or more conduits 6 to create a flow network that extends between the cylinder source pack 2 and a downstream processing unit 7. In a preferred embodiment, and as will be explained below, the present invention offers a solution to enable a cylinder source pack 2 containing the 12 high pressure cylinders 14 to be reliably and safely filled to a cylinder source pressure of 6000 psig with inert laser gas mixtures 3 and thereafter be able to regulate and reduce the pressure of the inert laser gas mixtures 3 from the cylinder source pressure to a substantially constant delivery pressure without the incidence or with reduced risk of failures or pressure surges. The cylinder source pack 2 containing the 12 high pressure cylinders 14 supplies on average 2-2.7× more gas by volume as deliverable product per cylinder in comparison to current available delivery gas systems, whereby the supply occurs under substantially constant delivery pressure without the likelihood of pressure surges or failures that would require the delivery to be stopped. The ability to deliver the gas 3 at substantially constant delivery pressure ensures that damage does not occur to any of the intended downstream processing units 7, which cannot process the gas 3 significantly above the target delivery pressure. Additionally, the increase in deliverable gas 3 reduces the frequency for change-out, thereby resulting in higher productivity, reduced downtime and reduced chance for personnel injury.

Inventors have determined that a 6000 psig, low leak rate, integrated regulator valve (designated as a "6 k IRV UHP valve") affixed onto each of the high pressure cylinders 14 is not technically feasible because each 6 k IRV UHP valve may undesirably regulate the gas 3 at a different pressure from its respective high pressure cylinder 14. As a result, the inventors have discovered that it is not possible for each 6 k IRV UHP valve fitted onto each of the high pressure cylinders 14 to deliver gas 3 at the same step-down regulated pressure. The inability to regulate the gas 3 at the same pressure creates an uneven flow of gas 3 from each of the high pressure cylinders 14. For these reasons, each of the high pressure cylinders 14 are fitted with a non-regulating (i.e., no step down in pressure) low leak rate valve referred to as a 6 k non-IRV UHP 25 shown in FIG. 1.

The 6K non-IRV UHP valve 25 contains a tied diaphragm that is structurally high integrity such that a low leak rate of no greater than 1 e-08 atm-cc/sec of helium across the seal located between a valve actuator at cylinder pressures exerted against the seal of up to 6000 psig. The seat of the 6 k non-IRV UHP valve 25 reduces or eliminates leakage of gas flow when the valve is in the closed position. The valve body is structurally designed to contain 6000 psig without rupture.

The fill manifold 4 is operably connected to the cylinder source pack 2. The fill manifold 4 consists of one or more conduits 6 positioned between the cylinder source pack 2 and the downstream processing unit 7 (e.g., a semiconductor fabrication unit).

To eliminate or significantly reduce the risk for occurrence of pressure surges to the processing unit 7, an automated redundant pressure regulation safety feature 5 is provided between the cylinder source pack 2 and the downstream processing unit 7. The automated redundant pressure regulation safety feature 5 ensures that gas 3 is delivered to the downstream processing unit 7 at a substantially constant delivery pressure. The automated redundant pressure regulation safety feature 5 as shown in FIG. 1 includes a primary integrated valve regulator (IRV) with no pressure relief valve (PRV) 8 in series arrangement with a backup IRV with a PRV 9. For the sake of clarity, "8" as used herein and throughout collectively refers to the primary IRV with no PRV for both the series arrangement (FIGS. 2a, 2b) and the parallel arrangement (FIGS. 3a and 3b) and "9" collectively refers to the backup IRV with the PRV in the series arrangement (FIGS. 2a, 2b) but refers to the backup IRV with no PRV in the parallel arrangement (FIGS. 3a and 3b).

The primary IRV 8 is tuned to receive gas 3 at the pressure in the high pressure cylinders 14 of the cylinder source pack 2 (e.g., up to a pressure of 6000 psig or more) and regulated and reduced to a delivery pressure (e.g., 800-1200 psig) that is suitable for usage at the downstream processing unit 7 such as a semiconductor fab unit. The backup IRV 9 is in a deactivated state which is defined as non-regulating (i.e., not regulating and reducing the pressure of gas 3). The backup IRV 9 does not release gas 3 through the PRV to atmosphere when the primary IRV 8 is regulating and reducing the cylinder source pressure of the gas 3 to the target or delivery pressure. In this manner, the process 11 eliminates or substantially reduces the risk for occurrence of failed pressure regulation by having two or more IRV's in a series arrangement along the fill manifold 4.

In the event that the primary IRV 8 has failed, the backup IRV 9 is configured to switch from the deactivated state to an activated state in response to the primary IRV 8 failing to regulate and reduce the pressure of the gas 3 from the cylinder source pressure to the target delivery pressure.

Figure 2A:
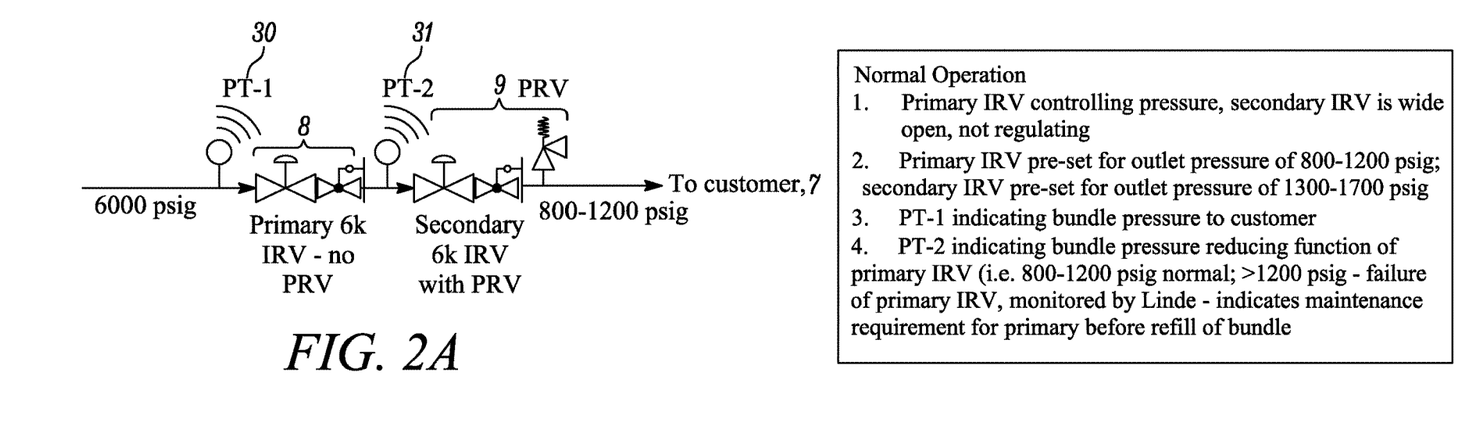
FIG. 2a illustrates a design of the automated redundant pressure regulation safety feature in accordance with the principles of the present invention, whereby a primary integrated regulator valve (IRV) with no PRV and a backup IRV with PRV are in a series arrangement along a fill manifold, and in which the primary IRV is regulating and reducing pressure of the gas withdrawn from a cylinder source pack while the backup IRV remains inactive.
Figure 2B:
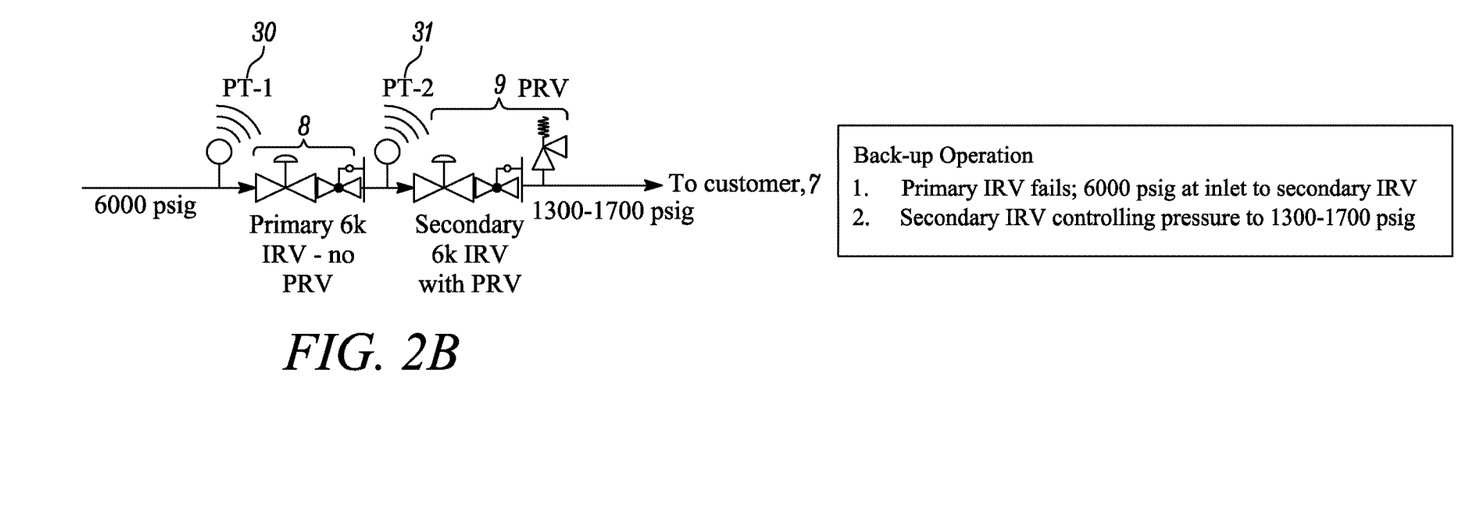
FIG. 2b is an alternative configuration of the automated redundant pressure regulation safety feature of FIG. 2a in which the primary IRV has failed thereby causing the backup IRV to become activated to regulate and reduce pressure of the gas withdrawn from the cylinder source pack, in accordance with the principles of the present invention.
Figure 3A:
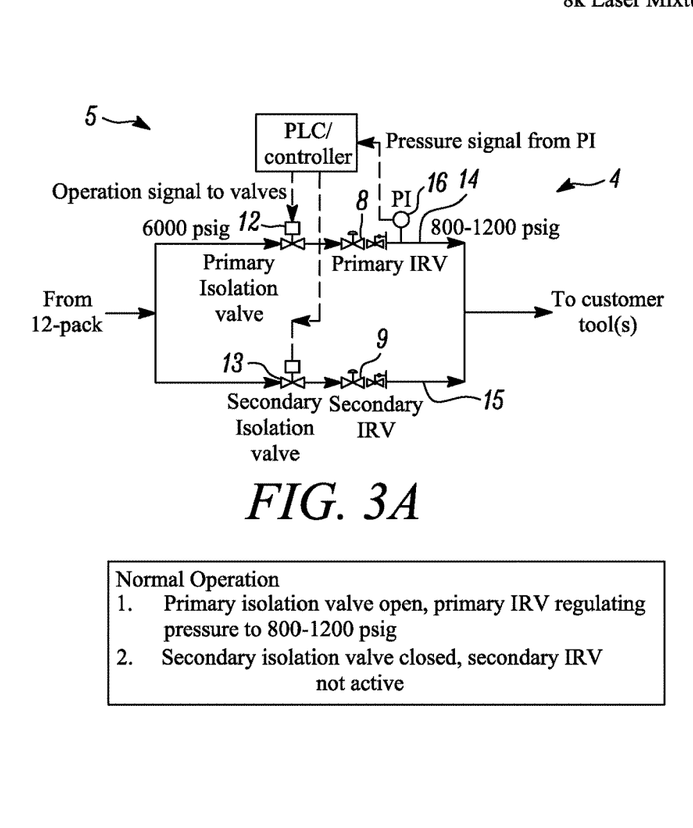
FIG. 3a illustrates a design of the automated redundant pressure regulation safety feature in accordance with the principles of the present invention, whereby a primary integrated regulator valve (IRV) with no PRV and a backup IRV with PRV are in a parallel arrangement along a fill manifold, and in which the primary IRV is regulating and reducing pressure of the gas withdrawn from a cylinder source pack while the backup IRV remains inactive.
Figure 3B:
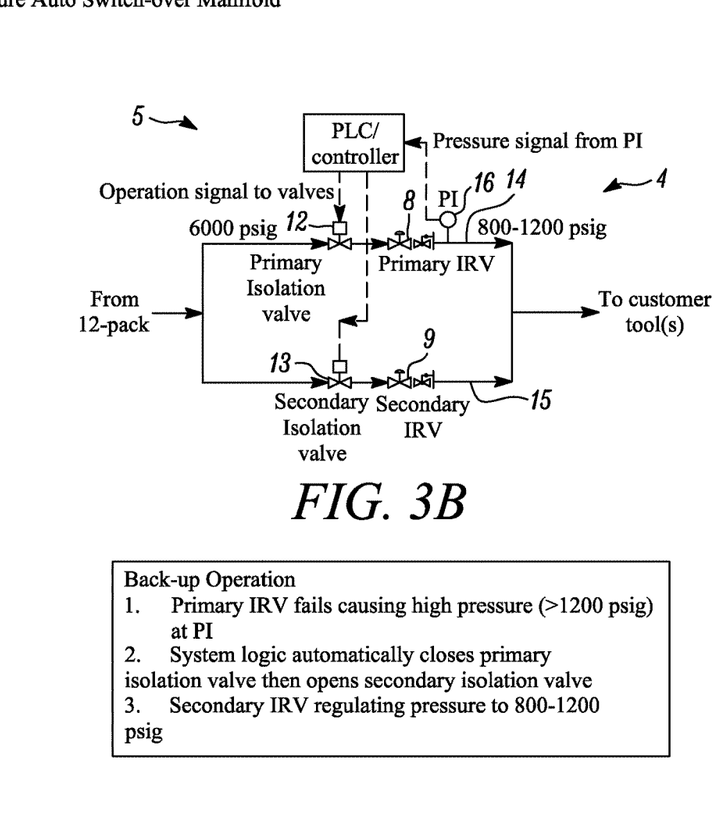
FIG. 3b illustrates an alternative design of FIG. 3a in which the primary IRV has failed thereby causing the backup IRV to become activated to regulate and reduce pressure of the gas withdrawn from the cylinder source pack, in accordance with the principles of the present invention.

In a preferred embodiment, the configuration of the primary IRV 8 and the secondary IRV 9 can be in series (FIG. 1, FIGS. 2a and 2b). To ensure supply of gas 3 at a substantially constant delivery pressure, the primary IRV 8 is configured to regulate pressure to a first set point. When the primary IRV with no PRV 8 has failed, the backup IRV 9 is configured to regulate pressure of the gas 3 to a second set point. The relative values of the first set point and second set point are of criticality to successful implementation of one aspect of the present invention. In particular, the second set point must be greater than the first set point. Inventors have discovered that the first set point cannot be the same as the second set point. When the first and second set points for the primary and backup IRV's 8 and 9, respectively, are tuned to the same value or substantially the same value, adverse interference or cross-talk between the primary IRV 8 and the backup IRV 9 can occur. Specifically, when the primary IRV 8 first opens to flow, it will typically exceed its set point at which it regulates and reduces pressure of the gas (before settling back to the desired set point). The momentary rise of pressure at the outlet of the primary IRV 8 will cause the backup IRV 9 to close, thereby increasing the pressure between the primary and secondary IRV's 8 and 9, respectively. The primary IRV 8 will respond by closing and the gas 3 between the primary and secondary IRV's 8 and 9 will decrease while the secondary IRV 9 is providing regulated flow. This open/close cycle will continue as the primary IRV 8 and backup IRV 9 attempt to regulate and reduce the pressure of the gas 3, thereby resulting in delivery pressure that is erratic. Erratic pressure, including pressure surges, can damage downstream processing units 7 which are typically sensitive to the excursions of pressure. Additionally, the erratic delivery pressure can lead to premature failure of both the primary IRV 8 and the backup IRV 9, thereby causing supply disruption.

The inventors have also discovered that the second set point is preferably not lower than the first set point as this effectively creates a two stage regulator performance in series arrangement in which the primary IRV 8 decreases the pressure at the outlet of the primary IRV 8 to a first lower value (e.g., from 6000 psig to 2500 psig) and the backup IRV 9 further decreases the pressure below that of the primary IRV 8 (e.g., from 2500 psig to 1000 psig). While such a series configuration is feasible, the inventors have observed that the continual movement of both IRVs 8 and 9 during flow/no-flow cycling conditions can cause premature wear and failure of both IRV's 8 and 9, thereby increasing frequency of supply disruption to downstream processing units 7.

Accordingly, the primary IRV 8 is set to regulate and reduce pressure of the gas 3 to a first set point at its outlet that is lower than a second set point of the backup IRV 9. In the event that the primary IRV 8 fails, which is determined by the pressure exiting the primary IRV 8 to be above the first set point, the backup IRV 9 will regulate and reduce pressure of the gas 3 from the cylinder source pack 2. As a result of the backup IRV 9 having a set point that is above the primary IRV 8, the backup IRV 9 is always open (i.e., no movement of valve regulating components) during normal operation of the primary IRV 8. Consequently, there is no wear imparted on the backup IRV 9 as a result of no movement and no oscillating or cycling between open and closed positions. In this manner, the backup IRV 9 remains on standby and is ready and available to regulate and reduce pressure of the gas 3 only in the event of failure of the primary IRV 8.

An exemplary embodiment of the cooperative function of the primary IRV 8 and secondary IRV 9 with specific delivery pressure set points will now be described with regards to FIGS. 2a and 2b. It should be understood that FIGS. 2a and 2b are intended to operate in connection with the fill manifold 4 and cylinder source pack 2 of FIG. 1, but details of the improved gas storage and delivery system 1 of FIG. 1 have been omitted in FIGS. 2a and 2b for purposes of more clearly describing the functionality of the automatic redundant pressure regulation safety feature 5. In this embodiment, each of the high pressure cylinders 14 are part of a cylinder source pack 2 consisting of 12 high pressure cylinders as shown in FIG. 1. Each of the 12 high pressure cylinders 14 contains a 6 k non-IRV UHP valve 25 that allows for high pressure storage at 6000 psig with low leakage therethrough. The high pressure cylinders 14 are interconnected to each other by a fill manifold 4. The gas 3 is preferably an inert laser gas mixture of electronics grade purity to be dispensed at a target delivery pressure of 800 to 1200 psig to a downstream processing unit 7 that is part of a semiconductor fabrication unit. Compositions of inert laser gas mixtures having electronics grade purity suitable for the present invention, include, but are not limited to (i) 10 ppm xenon, 3.5 vol % argon with a balance neon; or (ii) 1.25 vol % krypton with a balance neon. It should be understood that the present invention contemplates other types of electronic grade purity gases besides inert laser mixes. By way of example, helium, nitrogen, argon, oxygen and any combination thereof can be utilized.

The cylinder source pack 2, the primary IRV 8, the backup IRV 9, the first pressure device 30, the second pressure device 31, and the fill manifold 4 are pre-assembled, preferably at an industrial gas supplier site. The system 1 as pre-assembled is secured onto a modular supporting platform 10 (as represented by the dotted arrow in FIG. 1), which can then be delivered to the customer site. The modular supporting platform 10 in one example can comprise wheels with a locking brake that allows maneuverability as needed at the customer site and therewithin. The compactness of the modular supporting platform 10 provides "plug and operate" or "plug and play" capability for delivery of gases from multiple packaged gas sources such as, by way of example, a cylinder source pack 2, in an optimized manner at substantially constant delivery pressure, while decreasing cylinder change out due to increasing utilization of gas 3 from the packaged gas source. Upon the pre-assembled system 1 delivered to the customer site, the outlet of the fill manifold 4 is connected to a specific downstream processing site 7 for the plug and play installation.

Having connected the system 1 to the downstream processing site 7, certain components of the system 1, including the conduits 6 of fill manifold 4, can be leak tested to very integrity of the newly created connections to the downstream processing unit 7. After verifying leak integrity, a suitable inert gas may be utilized as part of a purging procedure to remove any residual moisture and air within the conduits 6, thereby reducing or eliminating the risk of contamination of the inert gas laser gas mixture 3 that is to be subsequently dispensed.

After purging is completed, each of the 6 k non-IRV UHP valves 25 affixed to high pressure cylinders 14 of source pack 2 are set to the open position to allow pressurized gas 3 to be withdrawn from each of their respective high pressure cylinders 14. The gas 3 enters conduit 6 of fill manifold 4. Referring to FIG. 2a, the gas 3 enters the inlet of primary IRV 8 at a pressure of approximately the source pressure, which is preferably 6000 psig or more. The primary IRV 8 acts as the pressure regulating valve whereby the pressure of the gas 3 at the outlet of the primary IRV 8 is regulated and reduced to the target delivery pressure of 800-1200 psig. With the gas 3 existing the outlet of the primary IRV 8 at such pressure, the secondary IRV 9 is pre-set to an outlet pressure of 1300-1700 psig, thereby remaining fully open in a non-regulating mode. The gas 3 passes through the secondary IRV 9 and flows towards the downstream processing unit 7 at the target delivery pressure of 800-1200 psig. In this manner, the primary IRV 8 is solely responsible for regulating the pressure of gas 3 from the source pressure of 6000 psig to the target delivery pressure of 800-1200 psig. The gas 3 continues to be regulated by primary IRV 8 until all of the gas 3 has been withdrawn from each of the 12 high pressure cylinders 14 of the cylinder source pack 2 or the requisite amount of gas 3 has been supplied to the downstream unit 7.

During the delivery of the gas 3, if the gas 3 exiting the primary IRV 8 is at a predetermined pressure unacceptably higher than 1200 psig, then the primary IRV 8 has failed. Such a scenario is illustrated in FIG. 2b. In this example, the gas 3 exits the outlet of the primary IRV 8 at approximately 6000 psig. As a result, the secondary IRV 9 is automatically mechanically configured from a standby mode or non-regulating position into the pressure regulating position to regulate and reduce the pressure of the gas 3 to 1300-1700 psig. The higher pre-set value of the second IRV 9 ensures that the pressure of the gas 3 is not erratic (for technical reasons explained hereinabove). The gas 3 continues to be regulated by the backup IRV 9 until substantially all of the gas 3 has been withdrawn from each of the high pressure cylinders 14 or the requisite amount of gas has been delivered to downstream unit 7. The backup IRV 9 ensures that the gas 3 is delivered to the downstream processing unit 7 at a substantially constant pressure of 1300-1700 psig, which remains within an acceptable operating range of the downstream processing unit 7.

During the regulation of gas 3 by the backup IRV 9, should the backup IRV 9 have failed, then the PRV will release the gas 3 to the atmosphere prior to the gas 3 flowing to the downstream unit 7. By releasing a portion of the gas 3, the significantly higher pressure gas (e.g., 2000 psig or more) does not damage the downstream unit 7. After the PRV has vented the excess pressure of the gas 3 to 3000 psig, the gas 3 resumes flow to the downstream processing unit 7. In this example, while not ideal, 3000 psig represents an approximate upper pressure limit that system 1 will deliver to the downstream processing unit 7 that it can handle without damage to any portion of the downstream processing unit 7.

Accordingly, as has been described, the present invention in a preferred embodiment offers a system 1 and process 11 to optimize supply of an inert laser gas mixture 3 from high pressure cylinders 14 of 6000 psig with automatic redundant pressure regulation 5 built into the delivery system 1 that can take into account pressure regulation failure in a systematic and safe way that maintains delivery pressure of the gas 3 within an acceptable limit without supply disruption to the semiconductor fab downstream processing unit 7.

In another embodiment, to further reduce the likelihood of a failure of an IRV, a third IRV without PRV can be positioned between the primary IRV 8 and the backup IRV 9. In such a series arrangement, all of the IRV's upstream of the backup IRV 9 do not have a PRV, and only the most downstream IRV along the fill manifold 4 is operably connected to a PRV. The third IRV positioned between the primary IRV 8 and the backup IRV 9 serves as a backup for the primary IRV 8 should the primary IRV 8 fail. The original backup IRV 9 to the primary IRV 8 serves as a backup to the third IRV in the event the third IRV fails. In this manner, more points of failure can be introduced into the process 11, thereby reducing the probability that all of the IRV's fail such that the PRV of the most downstream IRV (i.e., backup IRV 9) is required to vent excess pressure of the gas 3 into the atmosphere to enable the pressure of the gas 3 to be reduced to a pressure higher than the target delivery pressure (i.e., 800-1200 psig or 1300-1700 psig), but remain within an acceptable pressure such that flow of the gas 3 at the acceptable pressure can continue to flow and be handled by the downstream unit 7.

It should be understood that the present invention is not limited to the automatic redundant safety feature 5 having multiple IRV's configured in a series arrangement as illustrated by example in FIGS. 1, 2a and 2b. In an alternative embodiment, the primary IRV 8 and the backup IRV 9 are in a parallel arrangement as will now be described with regards to FIGS. 3a and 3b. It should be understood that FIGS. 3a and 3b are intended operate in connection with the fill manifold 4 and cylinder source pack 2 of FIG. 1, but details of the improved gas storage and delivery system 1 of FIG. 1 have been omitted in FIGS. 3a and 3b for purposes of more clearly describing the functionality of the automatic redundant pressure regulation safety feature 5' of FIGS. 3a and 3b. A primary isolation valve 12 is shown upfront of the primary IRV 8 along a first conduit 14 of the fill manifold 4. A secondary isolation valve 13 is shown upfront of the secondary IRV 9 along a second conduit 15 of the fill manifold 4. FIG. 3a shows that the primary isolation valve 12 is open to allow the primary IRV 8 to regulate and reduce the pressure of the gas 3. The secondary isolation valve 13 is in the closed position thereby preventing gas 3 from entering into the second conduit 15. The secondary IRV 9 can be set to the same target delivery pressure of 800-1200 psig as the primary IRV 8 (contrary to the series arrangement, in which the secondary IRV 9 must be set to a higher target delivery pressure than the primary IRV 8) because of the absence of cross-interference that occurs in the series arrangement as explained hereinabove. The gas 3 is introduced from the cylinder source pack 2 (e.g., a 12-cylinder source pack as shown in FIG. 1) at a source pressure of about 6000 psig or more. All of the gas 3 flows into the first conduit 14 of the fill manifold 4. Gas 3 flows through the primary isolation valve 12 and the primary IRV 8. The primary IRV 8 regulates and reduces the pressure of the gas 3 from 6000 psig to a delivery pressure of 800-1200 psig. The pressure of the gas 3 is continuously measured at the outlet of the primary IRV 8 by pressure indicator designated as "PI" 16 in FIGS. 3a and 3b. If the primary IRV 8 has a pressure not reduced to the target delivery pressure, then the primary IRV 8 is determined to have failed. In this example, during the course of delivery of gas 3 through the primary IRV, the PI 16 measures an outlet pressure that is unacceptably higher than 1200 psig and transmits a corresponding signal to the PLC. The PLC is inputted with the setpoint delivery pressure (e.g., 800-1200 psig) to allow it to determine when the primary IRV 8 has failed. The PLC will compare the higher pressure reading to that of the setpoint delivery pressure, determine that the primary PRV 8 has failed and then transmit a signal to the primary isolation valve 12 that causes the primary isolation valve 12 to close. The PLC will also transmit a signal to the secondary isolation valve 13 that causes the secondary isolation valve 13 to open.

As a result, gas 3 is redirected to flow through the second isolation valve 13 and into the secondary IRV 9 as shown in FIG. 3b. The secondary IRV 9 regulates pressure of the gas 3 to the target delivery pressure range of 800-1200 psig. The gas 3 is then directed to the downstream processing unit 7. With the second isolation valve 13 open, gas 3 continues to flow therethrough and the secondary IRV 9 until the delivery process 11 is completed (e.g., requisite amount of gas 3 has been delivered to the fab downstream unit 7) or the cylinder source pack 2 is depleted. The PI 16 continuously measures the pressure at the outlet of the secondary IRV 9 throughout the delivery to ensure the secondary IRV 9 is regulating and reducing pressure of the gas 3 to the target delivery pressure of 800-1200 psig. If at any time during the delivery of gas 3, the PI 16 measures the pressure of the gas 3 at the outlet of the secondary IRV 9 to be unacceptably greater than the upper limit of the target delivery pressure range of 1200 psig, then the PI 16 will send a signal to the PLC which will compare the measured pressure to the set point value and determine that the secondary IRV 9 has failed. The PLC will transmit an output signal causing the secondary isolation valve 13 to close. The delivery process 1 is aborted and flow of gas from the system 1 is stopped. A remote alert notification is sent to an authorized recipient, which can in turn result in manual or automatic closure of each of the 6K non-IRV UHP valves 25 affixed to each of the 12 high pressure cylinders 14. The modular supporting platform 10 is disconnected from the downstream processing unit 7 and the entire system 1 as assembled can be returned back to an industrial gas supplier to replace the primary IRV 8 and the secondary IRV 9.

Figure 5:
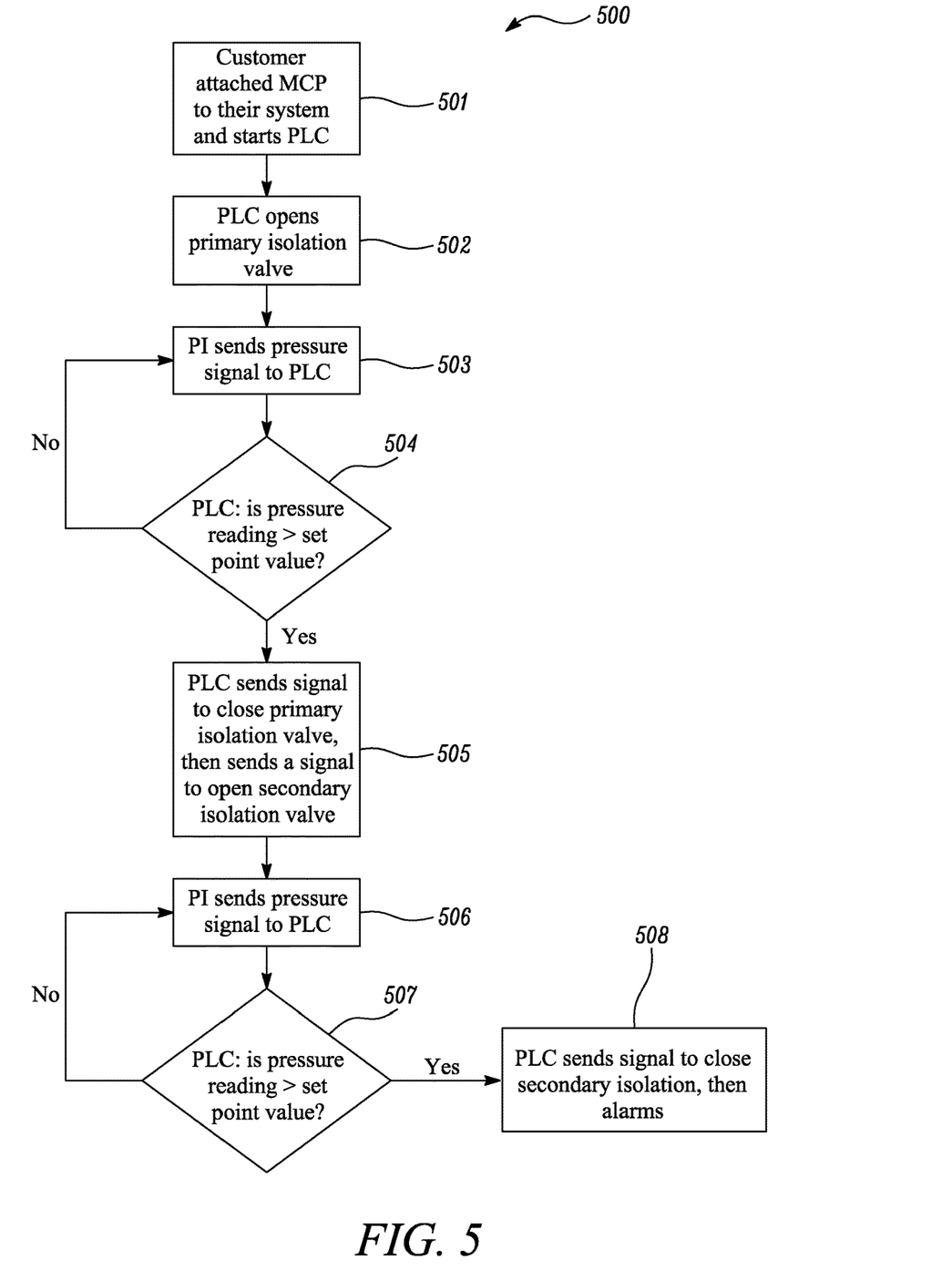
FIG. 5 shows a 12-cylinder pack IRV auto switch-over process logic flow diagram where the primary IRV and the secondary IRV are in a parallel arrangement.

FIG. 5 shows a process logic flow 500 that is involved in the parallel arrangement of FIGS. 3a and 3b for switching from the primary IRV 8 to the backup IRV 9. The steps shown refer to the decision making the PLC performs. Upon delivery to the customer site of the pre-assembled system 1 that is preferably affixed or secured to a modular platform 10, the customer can rapidly connect the multi cylinder package (MCP) to the downstream processing system 7 as a result of the plug and play feature of system 1. Having deployed and connected the system 1 to the downstream processing unit 7, the PLC is activated (step 501). The PLC has been previously inputted with the applicable delivery pressure set point at the gas supplier during the filling/refilling process. The PLC transmits a signal that enables the primary isolation valve 12 to open (step 502); the secondary isolation valve 13 remains closed. As gas 3 is withdrawn from the cylinder source pack 2 and is regulated and reduced in pressure by primary IRV 8, the PI continuously measures the real-time delivery pressure of the gas 3 to ensure the delivery pressure is within the set point prior to the gas 3 flowing to the downstream processing unit 7. The PI 16 sends an input signal indicative of the regulated and reduced pressure of the gas 3 measured at the outlet of the primary IRV 8 to the PLC (step 503). The PLC compares the measured pressure with the set point pressure. If the PLC determines that the measured pressure is unacceptably higher than the setpoint pressure (step 504), then the PLC will send an output signal to the primary isolation valve 12 that enables the primary isolation valve 12 to close, and the PLC sends another output signal to the secondary isolation valve 13 that enables the secondary isolation valve 12 to open (step 505), thereby redirecting gas 3 to flow through the secondary IRV 9. With gas 3 now being regulated and reduced to the delivery pressure by the secondary IRV 9, the PI 16 continuously measures real-time delivery pressure of the gas 3 to ensure the delivery pressure is within the setpoint prior to the gas 3 flowing to the downstream processing unit 7. The PI 16 sends an input signal indicative of the regulated and reduced pressure of the gas 3 measured at the outlet of the secondary IRV 9 to the PLC (step 506). The PLC compares the measured pressure with the setpoint pressure. If the PLC determines that the measured pressure is higher than the setpoint pressure (step 507), then the PLC will send an output signal to the secondary isolation valve 13 that enables the secondary isolation valve 13 to close, and an alarm notification is sent (step 508) indicating that the process is aborted. The system 1 can be disconnected from the customer downstream processing unit 7 and then delivered to a vendor or industrial gas supplier for replacement of the primary IRV 8 and/or secondary IRV 9, along with replenishing the high pressure cylinders 14 of the cylinder source pack 2 with the specific composition of gas 3.

Other variations to the parallel configuration are contemplated. For example, the backup isolation valve 13 can be removed and a PRV can be operably connected to the backup IRV 9 downstream of IRV 9. In such a design configuration, if each of the primary IRV 8 and the secondary IRV 9 fails, then the PRV will vent the excess pressure of gas 3 to atmosphere until the pressure has reached an acceptable level (e.g., 3000 psig) that is higher than the target delivery pressure (800-1200 psig) but can still be handled by the downstream processing unit 7 so that flow of gas 3 can resume at the applicable level without the need to abort the process 11.

Figure 4:
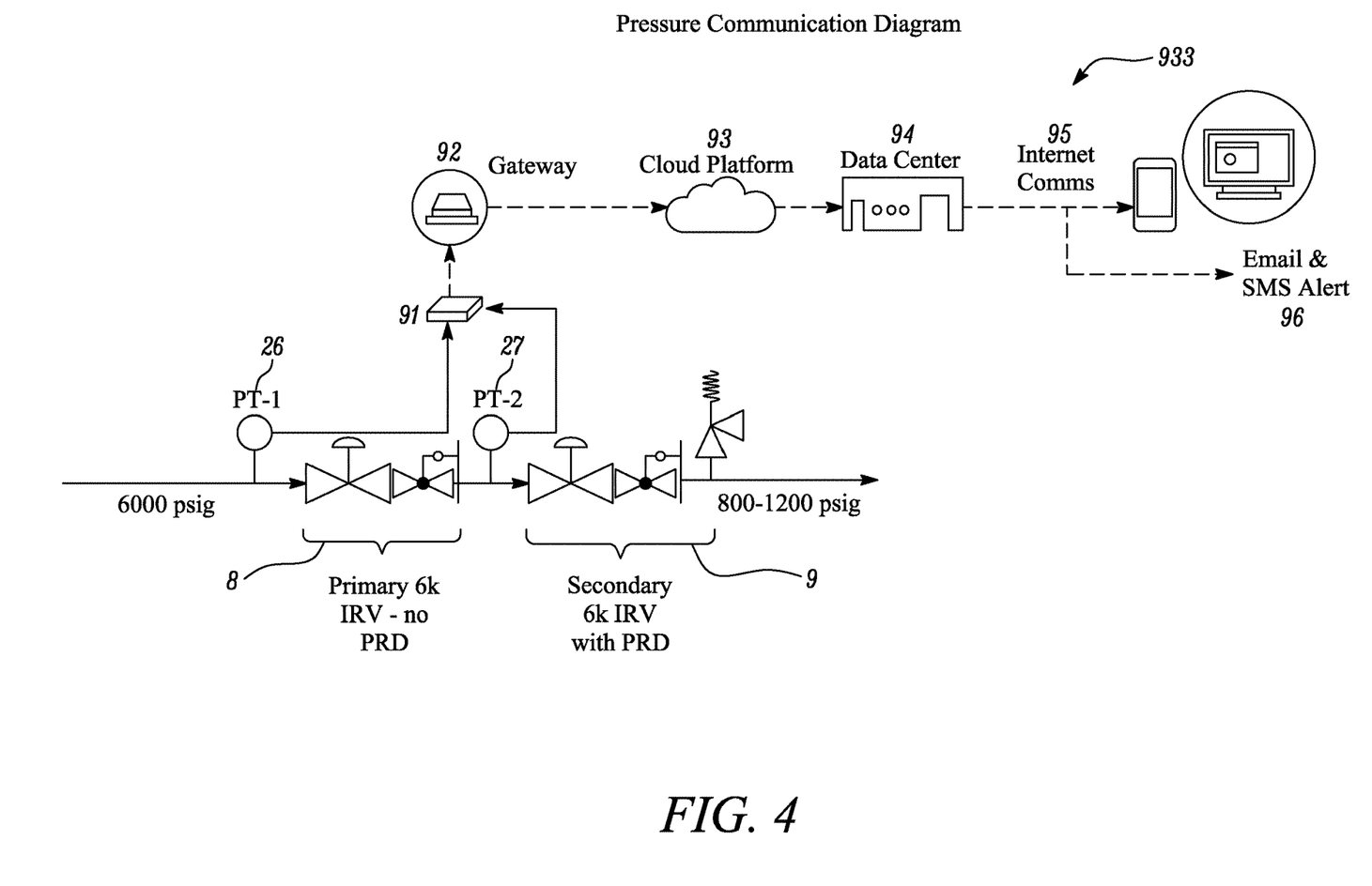
FIG. 4 shows a remote monitoring and alert notification system for the gas delivery process of FIG. 1 in accordance with the principles of the present invention.

Any of the embodiments of the present invention may have remote monitoring capabilities. In this regard, and by way of a non-limiting example, FIG. 4 shows an exemplary remote notification system 933 that can be utilized with the series arrangement of FIGS. 1, 2a and 2b. A first pressure transducer 26 is situated upstream of the primary IRV 8 along a conduit 6 of the fill manifold 4. A second pressure transducer 27 is situated downstream of the primary IRV 8 and upstream of the secondary IRV 9 along the fill manifold 4. The first pressure transducer 26 measures on a continuous basis the real-time source pressure of the gas 3 in the high pressure cylinders 14 and transmits a signal to a transmitter 91 which in turn transmits an output signal to a cellular gateway 92 that allows the pressure data to flow to a cloud platform 93. The cloud platform 93 consists of an operating system, hardware and server internet data center. The pressure data from the cloud platform 93 is transferred to a data center 94, which is a central location for collecting, analyzing and storing the pressure data from the first pressure transducer 26 and the second pressure transducer 27. In one example, the data center 94 belongs to an industrial gas supplier or vendor that delivers the system 1 to the customer site. The pressure data from the data center 94 can be sent to a receiver platform 96 via suitable internet communications 95 (e.g., wireless signal). The receiver platform 96 can be a text on a cell phone or an email to a dedicated email account of an end user or authorized recipient. As such, the transmitter 91, gateway 92, cloud platform 93, data center 94, internet communication signal 95 and receiver platform 96 form a "pressure communication pathway" 900 that allows remote monitoring capability of the process 11.

The second pressure transducer 27 measures on a continuous basis the real-time delivery pressure of the gas 3 at the outlet of the primary IRV 8 and transmits a corresponding signal indicative of the delivery pressure to the receiver platform 96 via the same pressure communication pathway shown in FIG. 4. When the second pressure transducer 27 relays a signal to the receiver platform 96 corresponding to a delivery pressure that is above acceptable limits via the pressure communication pathway 900, then an end user or authorized recipient is notified in real-time that the primary IRV 8 has failed and that the secondary IRV 9 is performing the regulating and reducing pressure of the gas 3. The end user or authorized recipient can begin preparations to abort the process, disconnect the system 1 from unit 7 and then return the system 1 on the modular platform 10 to a vendor or industrial gas supplier that can repair the primary IRV 8; or the end user or authorized recipient can continue to utilize the system 1 having knowledge that the secondary IRV 9 is being relied upon to regulate and reduce pressure of gas 3 and then direct the gas 3 to the downstream processing unit 7. In this manner, suitable remote monitoring of the operability of the primary IRV 8 and secondary IRV 9 can occur with notifications occurring via remotely transmitted alarms or shutdowns as the remote notification system 933 communicates on a real-time basis with the pressure transducers 16 and 27 to manage, monitor and store pressure data for the process 11 and system 1.

It should be understood that the parallel arrangement for the automatic redundant pressure regulation safety feature 5' can also be adapted to have remote notification system 933 via the pressure communication diagram 900. Additionally, the pressure communication diagram 900 can be configured to provide remote alert and fault notifications to registered remote devices.

While it has been shown and described what is considered to be certain embodiments of the invention, it will, of course, be understood that various modifications and changes in form or detail can readily be made without departing from the spirit and scope of the invention. For example, the packaged gas source may consist of a single high pressure cylinder rather than multiple high pressure cylinders that are manifolded for certain specialty gas applications. Alternatively, the packaged gas source may include one or more high capacity mobile containers as described in Applicants' US Patent Pub. No. 2019/0186694, which is incorporated herein in its entirety for all purposes. It is, therefore, intended that this invention not be limited to the exact form and detail herein shown and described, nor to anything less than the whole of the invention herein disclosed and hereinafter claimed.

The invention claimed is:

1. An improved gas storage and delivery system for regulating gas at a substantially constant delivery pressure, comprising:
   a cylinder source pack comprising 6 or more cylinders, each cylinder holding gas at a cylinder source pressure of 3000 psig or higher;
   the cylinder source pack operably connected to a fill manifold, said fill manifold comprising one or more conduits positioned between the cylinder source pack and a downstream processing unit;
   the fill manifold further comprising an automatic redundant pressure regulation safety feature,
   said automatic redundant pressure regulation safety feature comprising a primary integrated regulator valve (IRV), said automatic redundant pressure regulation safety feature further comprising a backup IRV operably connected to a PRV, wherein said backup IRV is in a deactivated state defined as non-regulating and not relieving any excess pressure of the gas in the fill manifold to atmosphere when the primary IRV is regulating and reducing the source pressure of the gas to the delivery pressure, and further wherein said backup IRV is adapted to switch from the deactivated state to an activated state in response to said primary IRV having failed to regulate and reduce the pressure of the gas from the cylinder source pressure to the delivery pressure.

2. The improved gas storage and delivery system of claim 1, wherein each of said 6 or more cylinders comprises an ultra-high purity tied diaphragm valve with a leak rate of no greater than 1e-08 atm-cc/sec of helium across a seal located between a valve actuator of the ultra-high purity tied diaphragm valve at the cylinder pressures exerted against the seal of up to 6000 psig.

3. The improved gas storage and delivery system of claim 1, wherein the primary IRV and the backup IRV are configured in a series arrangement along a first conduit of the fill manifold, said first conduit extending from the cylinder source pack to the downstream processing unit.

4. The improved gas storage and delivery system of claim 1, wherein the primary IRV and the backup IRV are configured in a parallel arrangement along the fill manifold, said primary IRV situated along a first conduit of the fill manifold and said backup IRV configured along a second conduit of the fill manifold.

5. The improved gas storage and delivery system of claim 1, further comprising a first pressure device located between the cylinder source pack and the primary IRV to measure the cylinder source pressure, and a second pressure device located between an outlet of the primary IRV and the backup IRV with PRV to measure the pressure of the gas at the outlet of the primary IRV.

6. The improved gas storage and delivery system of claim 1, wherein said downstream processing unit is a semiconductor fabrication unit and said gas is an inert laser gas mixture of electronics grade purity to be processed within the semiconductor fabrication unit.

7. The improved gas storage and delivery system of claim 5, further comprising a remote alert and notification system in communication with the first pressure device and the second pressure device.

8. A method for regulating gas at a substantially constant delivery pressure on an uninterrupted basis, comprising:
   withdrawing gas from a cylinder source pack having a cylinder source pressure of at least 3000 psig or higher;
   introducing the gas into a fill manifold;
   directing the gas along a first conduit of the fill manifold into an inlet of a first IRV;
   flowing the gas from the outlet of the first IRV and then directing the gas into an inlet of a second IRV that is operably connected to a PRV along the first conduit; followed by
   either performing a step of:

(i) maintaining the second IRV in an open position that is in a non-regulating position when a pressure of the gas at the outlet of the first IRV is regulated and reduced to the delivery pressure; or (ii) activating the second IRV from the non-regulating position to a pressure regulating position that regulates and reduces the pressure of the gas to the delivery pressure when the pressure of the gas at the outlet of the first IRV is determined to be at or above a set point value indicative of the first IRV having failed.

9. The method of claim 8, wherein the first IRV regulates and reduces the pressure of the gas to the delivery pressure, and in response thereto, the second IRV remains in the non-regulating position to enable the gas to flow to a downstream processing unit at the delivery pressure.

10. The method of claim 8, wherein the first IRV is determined to have failed such that the pressure is at or above the set point value, and in response thereto, the second IRV is automatically mechanically configured into the pressure regulating position to regulate and reduce the pressure of the gas to the delivery pressure.

11. The method of claim 8, wherein said first IRV has failed and further wherein said second IRV has failed and the PRV of said second IRV vents excess pressure of the gas into the atmosphere to enable the pressure of the gas to be reduced to a pressure higher than the delivery pressure, but within an acceptable pressure such that flow of the gas at the acceptable pressure is directed to the downstream unit.

12. The method of claim 8, further comprising:
a first pressure device transmitting a first signal to a transmitter, said first signal indicative of the cylinder source pressure of the cylinder source pack being depleted;
the transmitter receiving the first signal from the first pressure device and then relaying a second signal to an end user corresponding to a notification alert to replace the depleted cylinder source pack.

13. The method of claim 10, wherein the second IRV is automatically mechanically configured into the pressure regulating position without incidence of delivery pressure surges, and further wherein the second IRV continues to regulate and reduce the pressure of the gas to the delivery pressure until the cylinder source pack is depleted.

14. The method of claim 8, wherein the pressure of the gas entering an inlet of the second IRV is at or above the set point value indicative of the first IRV having failed such that step (ii) is triggered.

15. The method of claim 14, wherein the transition from step (i) to step (ii) occurs without a substantial occurrence of pressure surges, thereby allowing the gas to be delivered at a substantially constant delivery pressure.

16. The method of claim 8, further comprising directing the gas into a third IRV not operably connected to a PRV, said third PRV situated between the first IRV and the second IRV.

17. A method for regulating gas at a substantially constant delivery pressure on an uninterrupted basis, comprising:
withdrawing gas from a cylinder source pack having a cylinder source pressure of at least 3000 psig or higher;
introducing the gas into a fill manifold;
configuring into an open position a first isolation valve located upstream of a first IRV;
flowing the gas into an inlet of the first IRV located along a first conduit of the fill manifold while maintaining or configuring into a closed position a second isolation valve located upstream of the second IRV that is operably connected to a PRV, wherein each of said second isolation valve, second IRV and the PRV is situated along the second conduit;
measuring a pressure of the gas from an outlet of the first IRV; and either performing a step of:
(i) determining the first IRV to have failed based on the measured pressure at the outlet of the first IRV, and in response thereto;
closing the first isolation valve upstream of the first IRV, and opening the second isolation valve upstream of the second IRV and redirecting the gas through the second IRV along the second conduit;
regulating and reducing the pressure of the gas to a delivery pressure; and
directing the gas to a downstream processing unit; or
(ii) determining the first IRV to be in a regulating mode based on the measured pressure at the outlet of the first IRV, and in response thereto;
maintaining the first isolation valve of the first IRV in the open position, while maintaining the second isolation valve along the second conduit IRV in the closed position;
directing the gas through the first IRV along the first conduit;
regulating and reducing the pressure of the gas to the delivery pressure; and
directing the gas to the downstream processing unit.

18. The method of claim 17, comprising:
performing pre-delivery steps of
(i) purging the fill manifold with an inert gas; and
(ii) setting each cylinder valve of a cylinder source pack into an open position.

19. The method of claim 17, wherein the gas is an inert laser mixture of gas having an electronics grade purity as a part of the downstream processing unit that is a semiconductor fabrication unit.

20. The method of claim 17, comprising:
determining the first IRV has failed, and in response thereto
performing step (i); followed by
determining the secondary IRV has failed; and in response thereto:
(i) closing the secondary isolation valve;
(ii) closing each cylinder valve in the cylinder source pack; and
(iii) disconnecting the fill manifold from the downstream processing unit.

21. An improved gas storage and delivery system for regulating gas at a substantially constant delivery pressure, comprising:
a packaged gas source having a source pressure of up to 6000 psig;
a fill manifold operably connected to the packaged gas source, said fill manifold comprising a conduit positioned between the packaged gas source and a downstream processing unit;
an automatic redundant pressure regulation safety feature, said automatic redundant pressure regulation safety feature comprising a primary integrated regulator valve (IRV) and a backup IRV that is operably connected to a PRV;
wherein said automatic regulation safety feature is configured to switch from the primary IRV to the backup IRV upon determination of the primary IRV having failed, said switch occurring without incidence of delivery pressure surges.

22. The improved gas storage and delivery system of claim 21, wherein the redundant pressure regulation safety feature is located along the fill manifold.

23. The improved gas storage and delivery system of claim 21, wherein the redundant pressure regulation safety feature is located within an interior of the packaged gas source.

24. The improved gas storage and delivery system of claim 21, further comprising a first pressure device for measuring a pressure in the packaged source, and a second pressure device for measuring a pressure at an outlet of the primary IRV.

25. The improved gas storage and delivery system of claim 21, wherein the backup IRV is located downstream to the primary IRV along the fill manifold.

26. The improved gas storage and delivery system of claim 21, wherein the backup IRV is configured along a first conduit of the fill manifold and the primary IRV is located along a second conduit of the fill manifold, said second conduit in parallel arrangement to the first conduit.

27. The improved gas storage and delivery system of claim 24, wherein the packaged gas source, the primary IRV, the backup IRV, the first pressure device, the second pressure device, and the fill manifold are pre-assembled onto a modular supporting platform for plug and play installation at a downstream processing site.

28. The improved gas storage and delivery system of claim 21, said packaged gas source fitted with a 6000 psig, low leak rate, integrated regulator valve designated as "6K non-IRV UHP valve", said 6K non-IRV UHP valve including an ultra-high purity tied diaphragm configured to generate no greater than 1e-08 of helium leak rate across a seal located between a valve actuator with the cylinder source pressure adapted to hold up to 6000 psig or more.

29. The improved gas storage and delivery system of claim 21, wherein said automatic redundant pressure regulation safety feature is in communication with a pressure communication pathway.

30. A method for regulating gas at a substantially constant delivery pressure on an uninterrupted basis, comprising:
  withdrawing gas from a cylinder source pack having a cylinder source pressure of at least 3000 psig or higher;
  introducing the gas into a fill manifold;
  configuring into an open position a first isolation valve located upstream of a first IRV;
  flowing the gas into an inlet of the first IRV located along a first conduit of the fill manifold;
  measuring a pressure of the gas from an outlet of the first IRV; and either performing a step of:
  (i) determining the first IRV to have failed based on the measured pressure at the outlet of the first IRV, and in response thereto;
    closing the first isolation valve upstream of the first IRV, and redirecting a flow of the gas through the second IRV along a second conduit, said second IRV operably connected to a PRV;
    regulating and reducing the pressure of the gas to a delivery pressure; and
    directing the gas to a downstream processing unit; or
  (ii) determining the first IRV to be in a regulating mode based on the measured pressure at the outlet of the first IRV, and in response thereto;
    maintaining the first isolation valve of the first IRV in the open position to regulate and reduce the pressure of the gas to the delivery pressure; and
    directing the gas therethrough to a downstream processing unit at the delivery pressure.

31. The method of claim 30,
  performing step (i); followed by
  determining the secondary IRV has failed; and in response thereto, the PRV venting excess pressure of the gas into the atmosphere to enable the pressure of the gas to be reduced to a pressure higher than the delivery pressure, but within an acceptable pressure such that flow of the gas at the acceptable pressure is directed to the downstream unit.

* * * * *